(12) United States Patent
Ban

(10) Patent No.: US 11,867,840 B2
(45) Date of Patent: Jan. 9, 2024

(54) DEVICE FOR MEASURING DISTANCES

(71) Applicant: Safran Vectronix AG, Heerbrugg (CH)

(72) Inventor: Christian Ban, St. Gallen (CH)

(73) Assignee: SAFRAN VECTRONIX AG, Heerbrugg (CH)

( * ) Notice: Subject to any disclaimer, the term of this patent is extended or adjusted under 35 U.S.C. 154(b) by 434 days.

(21) Appl. No.: 17/122,026

(22) Filed: Dec. 15, 2020

(65) Prior Publication Data

US 2021/0190916 A1    Jun. 24, 2021

(30) Foreign Application Priority Data

Dec. 19, 2019    (EP) ..................................... 19218321

(51) Int. Cl.
| | |
|---|---|
| G01S 7/484 | (2006.01) |
| G01S 7/481 | (2006.01) |
| H01S 3/00 | (2006.01) |
| H01S 3/067 | (2006.01) |
| H01S 3/094 | (2006.01) |
| H01S 3/0941 | (2006.01) |
| H01S 3/16 | (2006.01) |
| H01S 3/23 | (2006.01) |
| H01S 3/1123 | (2023.01) |
| G01S 17/10 | (2020.01) |

(52) U.S. Cl.
CPC ............ *G01S 7/484* (2013.01); *G01S 7/4814* (2013.01); *G01S 17/10* (2013.01); *H01S 3/0078* (2013.01); *H01S 3/0675* (2013.01); *H01S 3/06716* (2013.01); *H01S 3/06754* (2013.01); *H01S 3/0941* (2013.01); *H01S 3/094003* (2013.01); *H01S 3/094065* (2013.01); *H01S 3/094076* (2013.01); *H01S 3/1608* (2013.01); *H01S 3/1618* (2013.01); *H01S 3/2308* (2013.01); *H01S 3/1123* (2023.01)

(58) Field of Classification Search
CPC .... H01S 3/1616; H01S 3/161; H01S 3/06716; H01S 3/0675; H01S 3/094003; H01S 3/094076
See application file for complete search history.

(56) References Cited

U.S. PATENT DOCUMENTS

| | | | |
|---|---|---|---|
| 6,288,775 B1 * | 9/2001 | Tanaka .................... | G01S 7/497 356/5.07 |
| 7,724,354 B2 | 5/2010 | Drodofsky et al. | |

(Continued)

FOREIGN PATENT DOCUMENTS

CN    105514774 A    4/2016

OTHER PUBLICATIONS

Z. Zhang et al. "High-Power Single-Frequency Thulium-Doped Fiber DBR Laser at 1943 nm", IEEE Photonics Technology Letters, vol. 23, No. 7, Apr. 1, 2011 (Year: 2011).*

(Continued)

*Primary Examiner* — Eric L Bolda

(57) ABSTRACT

The inventive Device is comprising a laser rangefinder for determining the distance along a laser axis between the device and a target object. The laser rangefinder is comprising a pumping laser and a thulium and/or holmium doped fiber laser with a thulium and/or holmium doped fiber section and two Bragg gratings arranged on both sides of the thulium and/or holmium doped fiber section of the thulium and/or holmium doped fiber laser wherein the thulium and/or holmium doped fiber laser is pumped by the pumping laser and configured to emit laser light with a wavelength in the range of 1900 nm to 2150 nm. The inventive device has an improved applicability.

14 Claims, 2 Drawing Sheets

(56) References Cited

U.S. PATENT DOCUMENTS

| | | | | |
|---|---|---|---|---|
| 10,234,283 | B2* | 3/2019 | Chang | G01S 7/4814 |
| 2009/0092157 | A1* | 4/2009 | Gapontsev | H01S 3/094003 |
| | | | | 372/6 |
| 2011/0158267 | A1* | 6/2011 | Tsai | H01S 3/113 |
| | | | | 372/11 |
| 2012/0205352 | A1* | 8/2012 | Fermann | H01S 3/06754 |
| | | | | 372/6 |
| 2016/0099542 | A1* | 4/2016 | Shin | H01S 3/0675 |
| | | | | 359/341.32 |
| 2018/0159296 | A1* | 6/2018 | Johnson | H01S 3/06758 |

OTHER PUBLICATIONS

Grzes et al. "Gain-Switched and Passively Mode-Locked Thulium Fiber Laser at 2 μm" 2018 Conference on Lasers and Electro-Optics Pacific Rim (CLEO-PR) (Year: 2018).*

Ouyang et al. "110 W All Fiber Actively Q-Switched Thulium-Doped Fiber Laser", IEEEPhotonics Journal, vol. 7, issue 1, (2015). (Year: 2015).*

Godard , "Infrared (2-12 μum) solid-state laser sources: a review" C. R. Physique 8, pp. 1100-1128 (Year: 2007).*

European Search Report completed Jun. 8, 2020, in European patent application No. 19218321.8, 9 pages.

Obronov I V et al., "Research of the Features of Generation Pulsed Radiation in Gain-Switch Thulium Fiber Lasers," Physics Procedia, vol. 71, May 1, 2017, pp. 287-292.

H Ahmad et al., "2.0-μm Q-Switched Thulium-Doped Fiber Laser with Graphene Oxide Saturable Absorber," IEEE Photonics Journal, IEEE, USA, vol. 5, No. 4, Aug. 1, 2013, 9 pages.

Christia Ban et al., "A Compact Dual-Wavelength Fiber Laser: Some Design Aspects," Proceedings of SPIE, SPIE, US, vol. 10192, May 1, 2017, pp. 101920G-101920G.

Atasi Pal et al., "All-fiber laser at 1.94 μm: effect on soft tissue," Progress in Biomedical Optics and Imaging, SPIE—International Society for Optical Engineering, Bellingham, WA, US, vol. 10062, Feb. 15, 2017, pp. 100620A-100260A.

* cited by examiner

DEVICE FOR MEASURING DISTANCES

CROSS-REFERENCE TO RELATED APPLICATIONS

This patent application claims priority to European Patent Application No. 19218321.8 filed Dec. 19, 2019, the contents of which are incorporated herein by reference in its entirety and for all purposes.

FIELD OF THE INVENTION

The invention relates to a device for measuring distances comprising a laser rangefinder.

BACKGROUND

Such devices have diverse fields of application, for example in hunting, for landmark navigation on land or at sea, for aiming at objects, for acquiring and documenting geographic surroundings, as information device for hikers, etc. In addition to such civilian fields of application, such devices are also used in the military sector for navigation, observation, etc. It is important for the device to be robust and compact.

The devices described here usually have measurement resolutions of the order of meters or, at best, decimeters, but have measurement ranges of several kilometers, for example of up to five, ten or twenty kilometers or even more. The devices can be designed for hand-held use by persons, i.e., for example, as field glasses or binoculars, monocular telescopes, spotting scopes, etc., but can by all means be attached to an equipment, a tripod or the like if necessary.

A preferred device treated here is an observation devices comprising an optically transmissive light channel, i.e. being conventional optical devices in terms of the basic function thereof, in which optical radiation is directed directly from the observed target object into the eye of the observer. However, in other embodiments, these can also be observation devices in which an observation image is recorded using a camera, the image is converted into electrical signals and the electrical signals are reproduced for the observer on a screen display. Devices with a screen allow the observation through an eyepiece, through which the recorded observation image can be observed. The observation path can comprise optical elements for beam shaping, beam deflection, mirroring information in and out, amplifying residual light, etc. Specifically, this can relate to hand-held observation devices or distance-measuring observation devices which are generically embodied for use as a hand-held device, for example by appropriate handles, shaping, etc.

The optical targeting enabled by the observation device also determines the direction of the distance measurement. The point to be measured is targeted by means of the transmissive light channel, for example by means of crosshairs in the observation channel of the device. Electro-optical distance meters or laser rangefinders (LRF) are emitting an optical signal, for example as optical radiation in the form of laser light pulses in the direction of the target object, the distance of which is intended to be determined. The surface of the target object casts back at least a portion of the emitted optical signal, usually in the form of a diffuse reflection. In the device, the cast-back optical radiation is converted into an electrical reception signal by a photosensitive detector element. The distance between the device and the target object can be determined with knowledge of the propagation speed of the optical signal and on the basis of the determined travel time between emission and reception of the signal (i.e. the travel time which light requires for covering the distance from the device to the target object and back again). There usually are one or more optical components for beam shaping, deflection, filtering, etc.—such as lens elements, wavelength filters, mirrors, etc.—in the optical transmission or reception path. Transmission and reception can be brought about coaxially using a single optical unit or separately using two separated optical units (e.g. arranged next to each other). Here, the distance meter or the rangefinder is integrated in the observation device.

The measurement requires sufficiently strong signal intensities, which can be detected by the receiver, of the returning reception signal. However, the signal power that can be emitted from the optoelectronic LRF considered here is restricted by physical and regulatory limits. Therefore, work is often undertaken with pulsed operation. Thus, the emitted optical signal is modulated in a pulse-like manner. Temporally short pulses with a high peak power are emitted, followed by pauses during which no light is emitted. Hence, the back reflected component of the pulses has a sufficiently high intensity to allow these to be evaluated in the presence of background disturbances and noise, in particular even in the presence of background light (sunlight, artificial illumination, etc.).

In the case of observation devices with rangefinders, ranges from several meters up to many kilometers, for example from 5 m to 20 km or 30 km, are required in this case, and this is required with a measurement accuracy of several meters or even higher measurement accuracy, for example of ±5 m or ±1 m or less. Since, in general, the measurement target does not have special reflective target markers for the measurement (as is conventional in measurement rods, measurement prisms etc. used in surveying), the applied optical distance measurement signal must be embodied and set in the device design in such a way that a distance measurement is possible over the whole specified measurement range (or the range must be specified on the basis of the possibilities of the used signal). Since only a small portion of the emitted radiation returns to the receiver in the case of natural or non-cooperative targets, usually the signal information from a plurality of pulses is used cumulatively (in particular in-phase) for the evaluation. In the process, the signal-to-noise ratio (SNR) is improved in order thereby also to enable measurements in adverse conditions. By using a plurality of measurement light pulses on the same target point, disturbance signals are removed by averaging and the target signal is amplified, corresponding to a theoretical SNR improvement of approximately the square root of the number of accumulated pulses.

In a typical use scenario, the user targets a desired target using the observation device and then triggers the distance measuring process, for example by actuating a trigger button or the like. Thereupon, the measurement result, or further in-depth information derived therefrom, such as coordinates, etc., is displayed to said user, preferably directly by means of the observation channel of the observation device.

The observation device can be equipped with means for determining geographic coordinates, such as a GPS, a constellation identifier, a direction measuring unit, a compass unit, tilt sensors or accelerometers, a night vision function, etc. Using an electronic display for providing information, it is possible, for example, to provide to the user in the transmitted light channel an image from a camera, location information, for example in the form of a map, measured distances or directions, stored information in respect of a sighted target object, temperature and weather information using the electronic display. Depending on field of application and demands on the respective measurement situation, the observation device may, in a modified embodiment, be equipped with e.g. a night vision module, etc. In this context, EP 1 744 196 proposes, in an exemplary manner, several different embodiments for a generic observation device, for example for target marking, for military applications or for hunting purposes.

U.S. Pat. No. 7,724,354 B2 discloses a laser rangefinder with a single mode master laser diode of series FOL 15DCWD emitting laser light with a wavelength within the bandwidth of 1530 nm to 1610 nm. The light emitted from the master diode is coupled via an optical fiber to an amplifier with an actively amplifying Er/Yb co-doped fiber which is optically pumped by a pumping diode having a centre wavelength at about 945 nm. Thus the output laser light of the master laser diode is coupled into and amplified by the amplifying fiber. The output of the amplifying fiber includes optical noise due to amplified spontaneous emission (ASE) emitted in a broad spectral band. A fiber-optical ASE filter in the form of a narrow band-pass filter is reducing the laser light of the laser rangefinder to light with the wavelength of the master laser diode within the bandwidth of 1530 nm to 1610 nm. The master diode and the pumping diode of the amplifying fiber are operated in a synchronized pulsed mode wherein the synchronisation is controlled by a pulse control unit. The laser light pulses are emitted by the laser rangefinder, reflected by the target object and received by the laser rangefinder. Travel time measurements between emission and reception are used to determine the distance between the laser rangefinder and the target object.

Laser rangefinders disclosed by U.S. Pat. No. 7,724,354 B2 are limited to using laser light with a wavelength of the master diode within the bandwidth of 1530 nm to 1610 nm, or at 1550 nm respectively. This limitation is reducing applicability of the disclosed laser rangefinders.

It is the object of the present invention to improve the applicability of a device with a laser rangefinder for measuring the distance to a targeted object.

SUMMARY

The inventive device is comprising a laser rangefinder for determining the distance along a laser axis between the device and a target. The laser rangefinder is comprising a laser transmission channel and a laser receiver channel extending along the laser axis.

The laser rangefinder of the inventive device is comprising a pumping laser and a thulium and/or holmium doped fiber laser with a thulium and/or holmium doped fiber section, two Bragg gratings arranged on both sides of the thulium and/or holmium doped fiber section, a pumping connection and an emitting connection on opposite ends of the thulium and/or holmium doped fiber laser wherein the pumping laser is connected to the pumping connection and the thulium and/or holmium doped fiber laser is configured to emit laser light with a wavelength in the range of 1900 nm to 2150 nm at the emitting connection.

The wavelength of the pumping laser light is preferably within the bandwidth of 1530 nm to 1610 nm. The thulium doped fiber laser acts as a wavelength converter from wavelengths in the range of 1550 nm to wavelengths in the range of 2000 nm. Laser rangefinders working with wavelengths above 1700 nm are invisible to practically all current night vision devices and imagining sensors of cameras.

Therefore, the inventive device with a laser rangefinder working in the range of 2000 nm is not visible to current night vision devices and imaging sensors. The thulium and/or holmium doped fiber laser allows a highly-efficient operation with a high slope efficiency. As a monolithic all-fiber configuration, it is robust to external mechanical perturbations. The laser rangefinder with a thulium doped fiber laser can be designed in a compact way.

The emissive transition of thulium around 2000 nm occurs between the excited state $^3F_4$ and $^3H_6$ ground energy levels. To excite the $^3F_4$ state, several pumping wavelengths can be used. The 793 nm absorption band $^3H_4$ can be pumped to excite the $^3F_4$ level. High brightness diodes emitting around this wavelength are available and it is possible to obtain high quantum efficiency thanks to cross relaxation effect, a process in which an ion in an excited state transfers part of its excitation to a neighbouring ion yielding to two excited ions for one pump photon. However, these types of laser diodes have typically a wavelength shift versus temperature of $\approx 0.3$ nm/° K, that is 30 nm for 100° K, which is a standard operational temperature range specified for military equipment.

Taking into account the narrow absorption line, about 17 nm in silica glass, for this transition, it turns out that a shift of the pumping wavelength will strongly change the efficiency of the system, thus the laser output power and finally the laser rangefinder performances. Therefore, the pumping of the $^3H_4$ band is not suitable with regards to application where the operational temperature can influence the system. The absorption band at 1200 nm is even narrower than the 793 nm absorption band and no compact and low cost laser source with high output power is currently available.

A further advantage of a thulium doped fiber laser is a low temperature sensitivity of typically 1 nm for 100° K. Therefore, the laser emission wavelength can be stabilized for all reasonable operating conditions within a spectral range of 1 nm without any active control systems. Moreover, wavelength drifts with temperature changes are minimal due to the wavelength-matched pair of Bragg gratings.

Another advantage of using an optical fiber laser is the output beam quality which is Gaussian (diffraction limited). Range finding with a circular beam cross section prevents missing the target which can occur with a non-symmetrical laser beam. Additionally, the availability of the output beam as well as of the reception beam in a fiber tail allows substantially independent location of the input/output laser port at a respective device with such a laser rangefinder.

In a preferred embodiment the pumping laser is pulsed. Pulsing of the pumping laser is configured to generate pulse trains in the form of sets of pulses, wherein consecutive sets of pulses are separated in time. The pumped thulium and/or holmium doped fiber laser is emitting corresponding pulse trains. Optionally, a pulse repetition rate of the emitted laser light is fixed by the pulse repetition rate of the pumping laser.

Instead of creating pulse trains by gain switching or modulation of a pumping laser, an optical component in the form of a Q-switch can be used for abruptly turning on and off the laser emission of the thulium and/or holmium doped fiber laser. For example, the pumped thulium and/or holmium doped fiber laser with two Fiber Bragg Gratings can be Q-switched by using a saturable absorber mirror (SAM), for example a semiconductor saturable absorber mirror (SESAM).

This configuration allows an efficient generation of pulse trains by controlling the Q-switch.

The pumping of the laser can be continuous and therefore with a simplified design of controlling electronics. An embodiment with a continuously pumped laser and a Q-switch generating the pulse train has a low temperature sensitivity due to the fact of the FBGs (fiber Bragg gratings) low temperature shift of 0.01 nm/K. The laser emission wavelength is stable within a spectral range of 1 nm for a temperature range of 100° C. without any active or passive control system.

The emitted pulse duration is proportional to the cavity round trip time and inversely proportional to the modulation depth of the SAM. Components used for Q-switching (crystal, SESAM) are arranged at the thulium and/or holmium-doped fiber and can make the assembly sensitive to shocks or vibrations. Therefore a stable interconnection is important.

The thulium and/or holmium doped fiber laser arranged between two Bragg gratings is preferably an active co-doped fiber with holmium (Ho) and/or erbium (Er) and/or ytterbium (Yb) and/or of neodymium (Nd) and/or of praesodymium (Pr) having a gain spectral band. More generically the active fiber is doped with metallic ions.

In a preferred embodiment, the pulsed pumping laser connected to the thulium and/or holmium doped fiber laser includes a single mode master laser diode, at least one amplifying Er/Yb co-doped fiber and a pumping diode wherein the at least one amplifying Er/Yb co-doped fiber is receiving pulsed light from the single mode master laser diode and is pumped by the synchronously pulsed pumping diode. The synchronous pulsing is ensuring selected signal pulse repetition rate. This pulsed pumping laser is a Master Oscillator Power Amplifier (MOPA) emitting high power pulses at a given repetition rate. The Master Oscillator Power Amplifier (MOPA) is configured to emit pulse trains suitable for laser rangefinders. The pulse length is in the order of one ns to few tens of ns and the laser wavelength is around 1555 nm at room temperature. The pulses are generated using a pulse generator unit.

In a further embodiment, the thulium and/or holmium-doped fiber laser is used combined with a Distributed Feed-Back (DFB) laser diode (LD) emitting at around 2000 nm. A pulse train can be formed by gain switching or modulation, respectively, of the drive current applied to the 2000 nm laser diode. Such a pulse train is amplified by at least one thulium and/or holmium-doped fiber (TDF) acting as power amplifier or a thulium and/or holmium-doped fiber amplifier (TDFA), respectively. The source performance characteristics comprising pulse duration, repetition rate and pulse energy can be independently controlled by a modification of the modulation current pulse train and the TDF pump power. This embodiment exhibits a good temporal stability of the pulse train (very low timing jitter). In this case the temporal jitter depends mainly on the stability of the drive current modulation of the laser diode.

The monolithic all-fiber configuration—i.e. the laser light is guided only by a (single) fiber from source to output optics—is robust to external mechanical perturbations. The shift of the central wavelength of 2000 nm of the LD is rather high at about 0.1 nm/K.

Additionally, the LD output power is temperature dependent as well. As for some specific applications the operational temperature range of the LRF device can reach $\Delta T \approx 100°$ C., it might be necessary to use an active stabilization of the band-pass filters, seed diode and TDFA pumps to compensate for the large temperature change, which increases the system complexity. Additionally, these devices typically have lower efficiency. LDs in this wavelength range exhibits typical continuous output powers of 2 to 10 mW. Taking into account considerably low duty cycle in the range of $10^{-9}$ to $10^{-8}$ in a pulsed regime, the average output power of the gain-switched laser diode can range from −40 to −20 dBm. To reach the required pulse energies and to avoid a high level of ASE, the TDFA should have a two-stage layout with moderate gain (typically in the range of 20-25 dB per stage) with intermediate ASE filtering, which is increasing cost, size and overall complexity.

The output of the pumping laser is a mono-mode fiber pigtail terminated with a connector at the end of the fiber. The connector is designed with an angle so that no back-reflections occurs thereby eliminating the need for an optical isolator at the fiber end. The connector is designed to expand the mode field diameter and thereby to lower the laser intensity thus reducing the damage threshold. A suitable connector is for example Diamond DMI PS APC 4. Instead of with connectors, the connection can be made by splicing the pump laser output fiber with the input fiber of the thulium and/or holmium fiber laser.

The accuracy of distance measurements based on the time of flight principle increases with shorter pulse lengths. Moreover, a decreasing pulse width enables to increase the peak optical output power which enables longer measurement range. To reduce the pulse length ($\tau p$) to a short duration, a short laser cavity has to be used. With $T_R$ being the cavity round trip time and $q_0$ being the saturation loss coefficient $\tau p$ is approximately equal to $3.52*T_R/q_0$. Consequently, highly doped $Tm^{3+}$-fiber should be used as a gain medium to absorb a large amount of pump light within a short distance (for example IXF-TDF-5-125 from iXblue). The passive fiber between the pair of Bragg gratings used as laser mirrors should be reduced to a minimum length.

In order to comply with high performance requirements, the laser pulses have to have high pulse energy. In order to comply with requirement for eye safety, a system to reduce or suppress the so called Amplified Spontaneous Emission (ASE) and the residual pump light at 1550 nm has to be implemented. Amplified Spontaneous Emission and pump light at 1550 nm have to be reduced as much as possible as they are hazardous for eyes and do not contribute to the accuracy of distance measurements. These unwanted lights can be reduced using an Amplified Spontaneous Emission filter.

In a preferred embodiment the device is comprising a fiber-optical filter connected to the emitting connection of the thulium and/or holmium doped fiber laser. In a further preferred embodiment, the laser light emitted by the thulium and/or holmium doped fiber laser is filtered by the fiber-optical filter wherein the fiber-optical filter is a band-pass filter preferably reducing the laser light of the laser rangefinder to light with wavelengths in a narrow band in the range of 1900 nm to 2150 nm.

A connector at the end of the Amplified Spontaneous Emission filter is providing a connection to transceiver optics acting as emitter optics. The connector determines the divergence of the emitted light beam and is designed with an angle preventing back-reflections and therefore no isolator is needed.

A preferred embodiment comprises an integrated coaxial laser pointer supporting easy bore sighting and allowing tactical pointing without the need of an additional pointer module. The laser pointer can be either Class 1 (eye safe) or Class 3B such as to comply with a specific maximum range specification for the device. The pointer is coupled to the laser rangefinder output. The pointer comprises a single mode pigtailed pointer diode emitting at a wavelength different from the laser rangefinder wavelength and coupled to the main optical path of the laser rangefinder by means of a fused Wavelength Division Multiplexer (WDM) or coupler, respectively. The Wavelength Division Multiplexer or coupler transmits the laser rangefinder and pointer beams along the same optical axis. The laser rangefinder can be used with or without pointer. The pointer light is preferably added to the fiber with the light of the laser rangefinder.

A preferred embodiment of the laser range finder comprises 5 major components: a laser transmitter, optics for transmitting and receiving, a receiver, electronics for processing all information needed for distance measurements and a housing. The laser transmitter is described above. The optics are preferably made of glass optimized for short-wavelength infrared. Coating may be applied to improve the optical transmission at the laser rangefinder and pointer wavelength. The laser transmitter and transmitting optics are collimating the laser beam to have a minimal divergence. Receiver optics and the receiver are receiving the reflected laser pulses.

In a preferred embodiment, the receiver comprises an interference filter matching the wavelength of the laser range finder wherein the interference filter is preferably a bandpass filter matched to the transmitted wavelength in front of the receiving element that can enhance the signal to noise ratio (SNR) by blocking ambient light noise. The receiver can be an APD or a PIN diode designed to detect short-wavelength infrared light. The detector performs an optical to electrical conversion and the respective electric signals are fed to electronics for generating the desired result information as e.g. target distance, target speed, target trajectory etc. The electric signals are sampled, digitized and processed. An applied algorithm, the short pulse length and an appropriate sampling rate allow high measurement accuracies.

Bend insensitive fibers especially designed for 2000 nm wavelength operation (operation in the wavelength range of 1900 nm to 2150 nm) are allowing minimizing the overall housing volume. Due to the fiber design, the laser system is rugged and robust without the need for stable construction elements for fixing components that could misalign during pyroshock, vibration, temperature cycling or temperature shocks.

Preferably the device comprises at least a first optical observation channel for observations defining a first observation optical axis by receiving and imaging optical light rays for optical observations by the eye of an observer.

The first optical observation channel can be a part of a binocular optical system with a first and a second binocular channel. The first binocular channel can comprise the first observation channel and the laser transmission channel, being used for transmission of the laser light towards the target. The second binocular channel can comprise the second observation channel and the laser receiver channel, being used for receiving of the laser light reflected at the target. The laser transmission channel can be coupled into the first observation channel and the laser receiver channel can be coupled into the second observation channel. Coupling can be provided by two beam splitters. The beam splitters can be semi-reflecting mirrors or prisms.

At least the first optical observation channel is comprising a first opto-electronic display means for displaying range information.

In a preferred embodiment, the observation device comprises an optically transmitting light channel, in which optical radiation is directed directly from the observed target object into the eye of the observer.

However, in another preferred embodiment the first observation channel, and if applicable the second observation channel respectively, comprise a first and a second opto-electronic display means, respectively, for real-time processing and digitally displaying the image of the first and second observation channel, respectively, providing additional displaying functionalities, in particular for displaying range information and/or color rendering for enhancing contrast and/or for displaying image information detected outside of the visual wavelength range.

In another embodiment the first observation channel comprises a first visual observation channel, in particular comprising the first opto-electronic display means, for real-time observing of the image plane of the first observation channel by eye, and an additional first electronic imaging channel comprising electronic imaging means, particularly CCD sensors and/or CMOS sensors and/or infrared detectors, for digitally receiving image information of the first observation channel and making said information available for the opto-electronic display means or for external post-processing.

BRIEF DESCRIPTION OF THE DRAWINGS

In the following, the device according to the invention is described in more detail in a purely exemplary manner on the basis of specific embodiments schematically depicted in the drawings. In detail.

DETAILED DESCRIPTION

Figure 1:
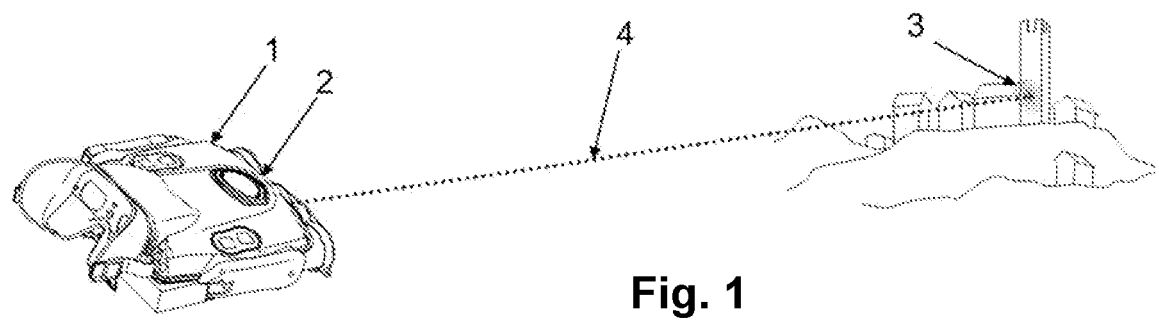
FIG. 1 is a schematic perspective view of an observation device observing a scenery with a target object.

FIG. 1 shows an observation device 1, comprising a laser rangefinder (LRF) 2 which is used for targeting a target object 3 in a scenery and for determining the distance between the observation device 1 and the target object 3. The distance is measured along a laser axis 4 by emitting light pulses and determining the travel time to the target object 3 and back to the observation device 1. The observation device 1 has a central observation direction which corresponds to the laser axis 4. The observation is made with at least a first optical observation channel defining a first observation optical axis corresponding to the central observation direction. At least the first optical observation channel is receiving and imaging optical light rays onto an image plane for optical observations by the eye of an observer. Crosshairs in the at least one optical observation channel can be used to indicate the target object 3 to which the distance measurement is made.

The first optical observation channel can comprise electronic imaging means, particularly CCD sensors and/or CMOS sensors and/or infrared detectors, for digitally receiving image information of the first observation channel and making said information available to the observer by a display means.

A user holds the observation device 1 and uses the generally magnifying observation channel to target the target object 3 and actuates a trigger in order to trigger a distance measurement. This opens a time window for the measurement. During the time window, signal information from a plurality of pulse components cast back by the target object 3 are accumulated in order to determine the distance.

By way of example, the end of the time window can be defined by reaching a predetermined minimum number of pulses to be accumulated or by reaching a minimum number of pulses at which a sufficient threshold of the accumulated information is obtained or on the basis of predetermined temporal measurement duration. The determined distance information is thereupon provided to the user or a data processing unit. In addition to specifying the determined distance in a display, there can also be a graphical specification of the spatial position and/or an information about the accuracy of the distance.

Figure 2:
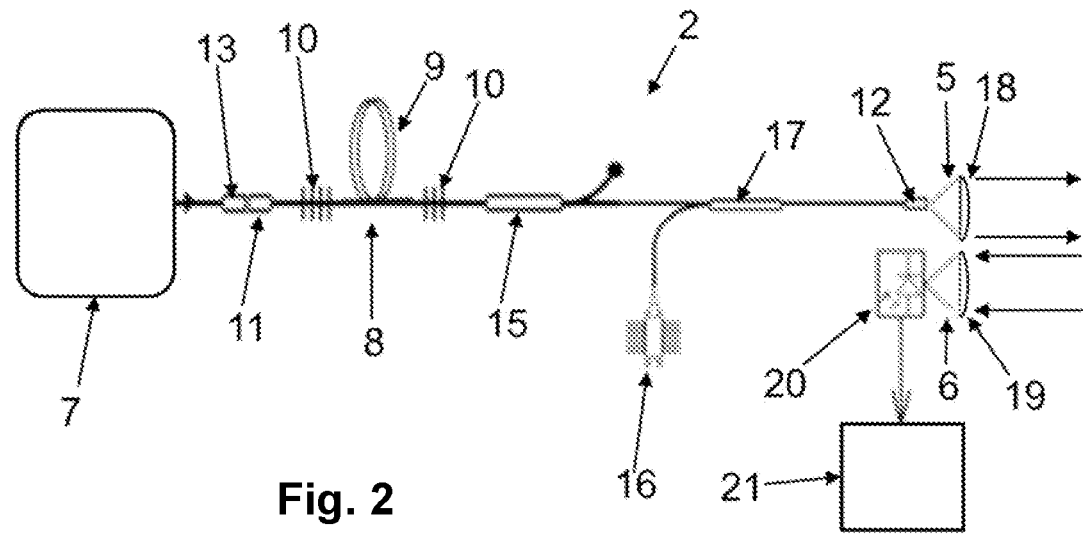
FIGS. 2 and 3 are schematic illustrations of laser rangefinders of inventive devices.
Figure 3:
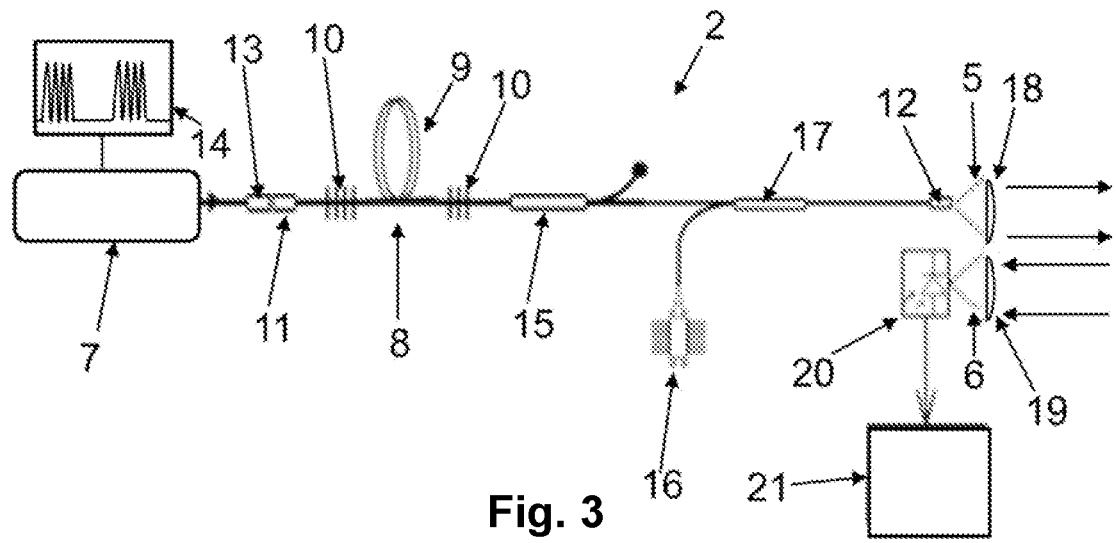

FIGS. 2 and 3 show schematic illustrations of laser rangefinders 2. The laser rangefinders 2 are comprising a laser transmission channel 5 and a laser receiver channel 6, wherein the laser light is emitted and received in directions along the laser axis 4. The laser rangefinders 2 are comprising a pumping laser 7 and a thulium and/or holmium doped fiber laser 8 with a thulium and/or holmium doped fiber section 9, two Bragg gratings 10 arranged on both sides of the thulium and/or holmium doped fiber section 9, a pumping connection 11 and an emitting connection 12 on opposite ends of the thulium and/or holmium doped fiber laser 8. The pumping laser 7 is connected with its output connector 13 to the pumping connection 11.

The thulium and/or holmium doped fiber laser 8 is configured to emit laser light with a wavelength in the range of 1900 nm to 2150 nm at the emitting connection 12. A preferred pumping laser 7 is configured to emit laser light with a wavelength in the bandwidth of 1530 nm to 1610 nm.

The pumping laser 7 of the embodiment of FIG. 3 is a pulsed pumping laser emitting pulsed laser light. The generation of pulses is controlled by a pulse generator unit 14. The pumping laser 7 is generating pulse trains in the form of sets of pulses, wherein consecutive sets of pulses are separated in time. The pumped thulium and/or holmium doped fiber laser 8 is emitting corresponding pulse trains.

Instead of using a pulsed pumping laser, emitting pulse trains by the thulium and/or holmium doped fiber laser 8 can be achieved by an optical component in the form of a Q-switch arranged at the emitting connection 12 of the thulium and/or holmium doped fiber laser 8. The Q-switch is configured to abruptly turning on and off the laser emission and thereby enabling emitting of pulse trains.

In a preferred embodiment, the laser rangefinder 2 is comprising a fiber-optical filter 15 preferably arranged between the thulium and/or holmium doped fiber laser 8 and the emitting connection 12. The fiber-optical filter 15 is preferably a band-pass filter reducing the laser light of the laser rangefinder 2 to light with wavelengths in the range of 1900 nm to 2150 nm.

The pumping laser 7 connected to the thulium and/or holmium doped fiber laser 8 preferably includes a single mode master laser diode, at least one amplifying Er/Yb co-doped fiber and a pumping diode. The at least one amplifying Er/Yb co-doped fiber is receiving light from the single mode master laser diode and is pumped by the pumping diode. In a preferred embodiment such a pumping laser 7 is configured as a pulsed pumping laser, wherein the single mode master laser diode and the pumping diode are synchronously pulsed. The pulsed pumping laser is preferably a Master Oscillator Power Amplifier (MOPA) configured to emit pulse trains suitable for the laser rangefinder wherein the pulse length is in the order of one ns to few tens of ns and the laser wavelength is around 1555 nm at room temperature.

In a further embodiment the laser rangefinder comprises a Distributed Feed-Back (DFB) laser diode (LD) emitting laser light at a wavelength around 2000 nm and being connected to the pumping connection of the thulium and/or holmium doped fiber laser wherein the Distributed Feed-Back laser is configured to form a pulse train by gain switching or modulation, respectively, of the drive current applied to the 2000 nm laser diode. For example, the pumping laser being embodied as a DFB-diode means single longitudinal mode operation of the laser rangefinder wherein the system represents a single-pass pulse generation system, so the source performance characteristics (pulse duration and repetition rate, pulse energy) can be independently controlled by a modification of the modulation current pulse train.

In a further preferred embodiment, the measuring point on the object 3 to which the distance measurement is made can be marked. The observation device 1 or preferably the laser rangefinder 2 comprises an integrated coaxial laser pointer 16. The laser pointer 16 preferably comprises a single mode pigtailed pointer diode emitting at a wavelength different from the laser rangefinder wavelength and coupled to the main optical path of the laser rangefinder 2 by means of a fused Wavelength Division Multiplexer (WDM) or coupler 17, respectively.

The laser range finder 2 comprises a laser transmitter with the thulium and/or holmium doped fiber laser 8, optics for transmitting 18 and for receiving 19 laser light, a receiver 20 and electronics 21 for processing all information needed for distance measurements wherein the laser transmitter and transmitting optics 18 are collimating the laser beam and the receiver optics 19 and the receiver are receiving the reflected laser light.

The first optical observation channel is a channel of a monocular or binocular optical system with at least a first and preferably a second optical channel. The channels for transmitting and for receiving laser light can be arranged in optical channels.

Figure 4:
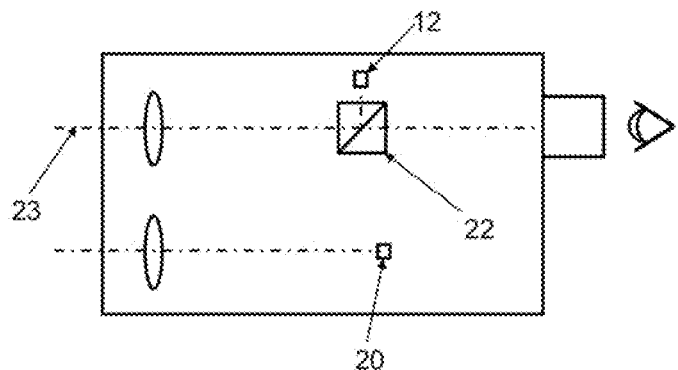
FIGS. 4 to 7 are schematic illustrations of optical assemblies of observation devices.
Figure 5:
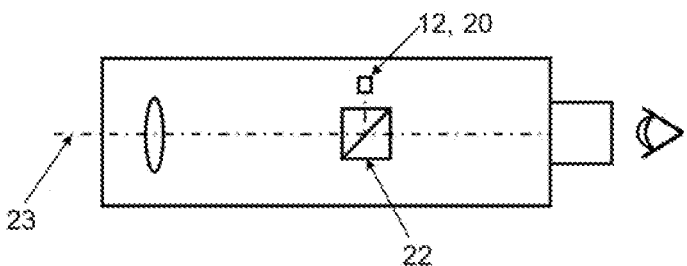

FIGS. 4 to 7 show different arrangements of optical and laser channels. FIG. 4 shows a solution with one optical channel and a transmitting laser channel arranged in the optical channel wherein the emitting connection 12 is supplying laser light and an optical element 22 is directing the laser light along an optical axis 23. The receiving laser channel with the receiver 20 is arranged separate from the optical channel. FIG. 5 shows a solution with one optical channel and the transmitting as well as the receiving laser channels arranged in the optical channel. The emitting connection 12 is supplying laser light and an optical element 22 is directing the laser light along an optical axis 23. The returning laser light is directed by the optical element 22 to the receiver 20.

Figure 6:
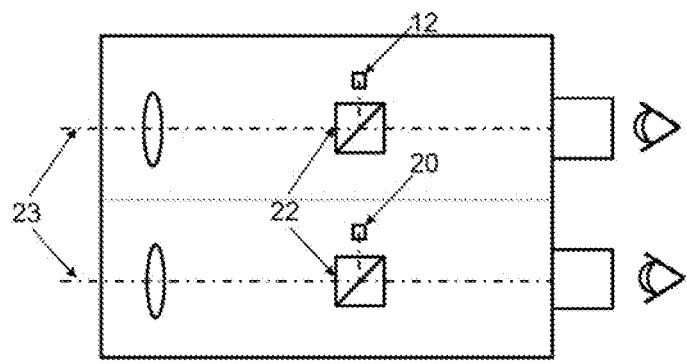

FIG. 6 shows a solution with two optical channels wherein one is including the transmitting laser channel and the other the receiving laser channel. Laser light from the emitting connection 12 is redirected by the optical element 22 along the optical axis 23. Returning laser light is redirected by the other optical element 22 to the receiver 20.

Figure 7:
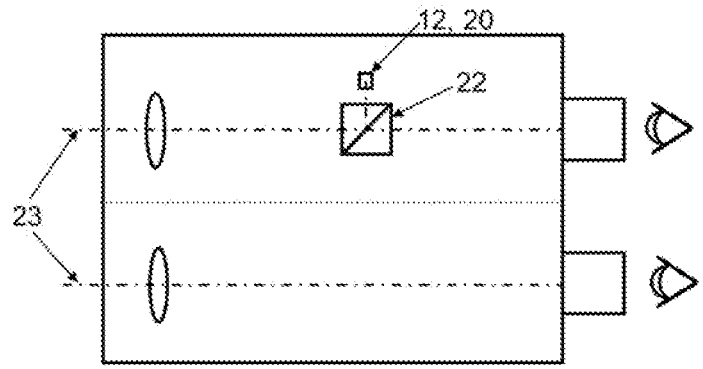

FIG. 7 shows a solution with two optical channels wherein one is including the transmitting and the receiving laser channel. Laser light from the emitting connection 12 is redirected by the optical element 22 along the optical axis 23. Returning laser light is redirected by the optical element 22 to the receiver 20.

What is claimed is:

1. Device for measuring distances, comprising:
   a laser rangefinder for time-of-flight based distance determination along a laser axis between the device and a target object, the laser rangefinder comprising a laser transmission channel and a laser receiver channel, wherein the laser rangefinder comprises a pumping laser, a thulium and/or holmium doped fiber laser with a thulium and/or holmium doped fiber section in between two Bragg gratings and an emitting connection, wherein the thulium and/or holmium doped fiber laser is pumped by the pumping laser and configured to output laser light with a wavelength in the range of 1900 nm to 2150 nm, wherein the device comprises an integrated coaxial laser pointer wherein the laser pointer comprises a single mode pigtailed pointer diode emitting at a wavelength different from the laser rangefinder wavelength and coupled to the main optical path of the laser rangefinder by means of a fused Wavelength Division Multiplexer or coupler, respectively.

2. Device according to claim 1, wherein the pumping laser is configured to provide laser light with a wavelength in the bandwidth of 1530 nm to 1610 nm.

3. Device according to claim 1, wherein the pumping laser is pulsed and thereby configured to generate pulse trains in the form of sets of pulses, wherein consecutive sets of pulses are separated in time wherein the pumped thulium and/or holmium doped fiber laser is emitting corresponding pulse trains.

4. Device according to claim 1, wherein the emitting connection of the thulium and/or holmium doped fiber laser is comprising an optical component in the form of a Q-switch wherein the Q-switch is configured to abruptly turning on and off the laser emission and thereby enabling emitting of pulse trains.

5. Device according to claim 1, wherein the laser rangefinder comprises a fiber-optical filter arranged between the thulium and/or holmium doped fiber laser and the emitting connection wherein the fiber-optical filter is a band-pass filter reducing the laser light of the laser rangefinder to light with wavelengths in the range of 1900 nm to 2150 nm.

6. Device according to claim 1, wherein the laser range finder comprises a laser transmitter or an emitting connection, optics for transmitting and receiving laser light, a receiver and electronics for processing all information needed for distance measurements wherein the laser transmitter and transmitting optics are collimating the laser beam and the receiver optics and the receiver are receiving the reflected laser light.

7. Device according to claim 1, wherein the device comprises at least a first optical observation channel for observations defining a first observation optical axis by receiving and imaging optical light rays for optical observations by the eye of an observer.

8. Device according to claim 7, wherein the first optical observation channel is a channel of a monocular or binocular optical system with at least a first and a second-optical channel.

9. Device according to claim 8, wherein the first optical channel, comprising the first observation channel and the laser transmission channel, being used for transmission of the laser light towards the target, and the second optical channel, comprising a second observation channel and the laser receiver channel, being used for receiving of the laser light reflected at the target object, with the laser transmission channel being coupled into the first observation channel and the laser receiver channel being coupled into the second observation channel, wherein coupling happens by two beam splitters or optical elements, respectively, the beam splitters being semi-reflecting mirrors or prisms.

10. Device according to claim 7, wherein at least the first optical observation channel is comprising a first opto-electronic display means preferably for displaying range information.

11. Device according to claim 10, wherein at least the first optical observation channel is comprising electronic imaging means including CCD sensors and/or CMOS sensors and/or infrared detectors, for digitally receiving image information of the first observation channel and making said information available for the first opto-electronic display means and/or for external post-processing.

12. Device for measuring distances, comprising:
a laser rangefinder for time-of-flight based distance determination along a laser axis between the device and a target object, the laser rangefinder comprising a laser transmission channel and a laser receiver channel, wherein the laser rangefinder comprises a pumping laser, a thulium and/or holmium doped fiber laser with a thulium and/or holmium doped fiber section in between two Bragg gratings and an emitting connection, wherein the thulium and/or holmium doped fiber laser is pumped by the pumping laser and configured to output laser light with a wavelength in the range of 1900 nm to 2150 nm, wherein the pumping laser connected to the thulium and/or holmium doped fiber laser includes a single mode master laser diode, at least one amplifying Er/Yb co-doped fiber and a pumping diode wherein the at least one amplifying Er/Yb codoped fiber is receiving light from the single mode master laser diode and is pumped by the pumping diode and wherein the pumping laser is a pulsed pumping laser wherein the single mode master laser diode and the pumping diode are synchronously pulsed and the pulsed pumping laser is a Master Oscillator Power Amplifier (MOPA) configured to emit pulse trains suitable for the laser rangefinder wherein the pulse length is in the order of one ns to few tens of ns and the laser wavelength is around 1555 nm at room temperature.

13. Device according to claim 12, wherein a pulse repetition rate of the emitted laser light is fixed by the pulse repetition rate of the pumping laser.

14. Device for measuring distances, comprising:
a laser rangefinder for time-of-flight based distance determination along a laser axis between the device and a target object, the laser rangefinder comprising a laser transmission channel and a laser receiver channel, wherein the laser rangefinder comprises a pumping laser, a thulium and/or holmium doped fiber laser with a thulium and/or holmium doped fiber section in between two Bragg gratings and an emitting connection, wherein the thulium and/or holmium doped fiber laser is pumped by the pumping laser and configured to output laser light with a wavelength in the range of 1900 nm to 2150 nm, wherein the laser rangefinder comprises a Distributed Feed-Back (DFB) laser diode emitting laser light at a wavelength around 2000 nm and being connected to a pumping connection of the thulium and/or holmium doped fiber laser wherein the Distributed Feed-Back laser is configured to form a pulse trains by gain switching or modulation, respectively, of the drive current applied to the 2000 nm laser diode.

* * * * *